(12) United States Patent
Katsumata et al.

(10) Patent No.: US 10,887,988 B2
(45) Date of Patent: Jan. 5, 2021

(54) CIRCUIT SUBSTRATE, COMPONENT-MOUNTED SUBSTRATE, AND METHODS OF MANUFACTURING CIRCUIT SUBSTRATE AND COMPONENT-MOUNTED SUBSTRATE

(71) Applicant: NICHIA CORPORATION, Anan (JP)

(72) Inventors: Masaaki Katsumata, Anan (JP); Koji Taguchi, Anan (JP); Norifumi Sasaoka, Tokushima (JP); Yosuke Noda, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/583,160

(22) Filed: Sep. 25, 2019

(65) Prior Publication Data

US 2020/0100360 A1 Mar. 26, 2020

(30) Foreign Application Priority Data

Sep. 26, 2018 (JP) .................................. 2018-180393

(51) Int. Cl.
*H05K 1/11* (2006.01)
*H05K 1/09* (2006.01)
*H01L 33/62* (2010.01)

(52) U.S. Cl.
CPC .............. *H05K 1/115* (2013.01); *H01L 33/62* (2013.01); *H05K 1/095* (2013.01);
(Continued)

(58) Field of Classification Search
CPC ........ H05K 1/095; H05K 1/115; H05K 1/116; H05K 1/181; H05K 3/4084; H05K 3/3468;
(Continued)

(56) References Cited

U.S. PATENT DOCUMENTS

| 6,143,116 A | 11/2000 | Hayashi et al. |
| 2005/0257952 A1 | 11/2005 | Morimoto et al. |

(Continued)

FOREIGN PATENT DOCUMENTS

| JP | 07-176847 | 7/1995 |
| JP | 07-176871 | 7/1995 |

(Continued)

*Primary Examiner* — Paresh H Paghadal
(74) *Attorney, Agent, or Firm* — Mori & Ward, LLP

(57) ABSTRACT

A method of manufacturing a circuit substrate including forming, in an insulating substrate and circuit patterns that are provided on a first surface and a second surface of the insulating substrate, a through-hole penetrating the insulating substrate and the circuit patterns, where the circuit patterns contain Cu as a main component. The method including filling, in the through-hole, an electrically conductive paste that is a melting-point shift electrically conductive paste including Sn—Bi solder powder, Cu powder, and resin, and forming a protrusion obtained by causing the electrically conductive paste to protrude from the through-hole. The method further including performing pressure treatment on the protrusion near the through-hole; and performing heat treatment on the insulating substrate whose protrusion is subjected to the pressure treatment and causing the circuit patterns and the electrically conductive paste to be electrically connected with each other.

12 Claims, 10 Drawing Sheets

(52) U.S. Cl.
CPC ...... *H01L 2933/0066* (2013.01); *H05K 1/112* (2013.01); *H05K 2201/09454* (2013.01); *H05K 2201/09572* (2013.01); *H05K 2201/09854* (2013.01); *H05K 2201/10106* (2013.01)

(58) Field of Classification Search
CPC . H05K 2201/09572; H05K 2203/0511; H05K 1/11; H05K 1/112; H05K 2201/09454; H05K 2201/09563; H05K 2201/09645; H05K 2201/9454; H05K 2201/9854; H01L 33/62
See application file for complete search history.

(56) References Cited

U.S. PATENT DOCUMENTS

| | | | |
|---|---|---|---|
| 2006/0057340 | A1 | 3/2006 | Umeda et al. |
| 2007/0148829 | A1* | 6/2007 | Yoshino ............... H05K 3/4046 438/128 |
| 2007/0154741 | A1* | 7/2007 | Takahashi ............. H05K 1/115 428/413 |
| 2011/0100690 | A1 | 5/2011 | Yoshimura et al. |
| 2013/0062107 | A1 | 3/2013 | Higuchi et al. |
| 2013/0233618 | A1* | 9/2013 | Nakano ................. B23K 35/025 174/94 R |
| 2014/0124250 | A1 | 5/2014 | Iwasaki et al. |
| 2017/0062100 | A1* | 3/2017 | Yosui ................. H01L 23/49822 |

FOREIGN PATENT DOCUMENTS

| | | |
|---|---|---|
| JP | 10-190191 | 7/1998 |
| JP | 2005-093556 | 4/2005 |
| JP | 2005-332907 | 12/2005 |
| JP | 2006-012734 | 1/2006 |
| JP | 2008-108629 | 5/2008 |
| JP | 2011-096900 | 5/2011 |
| JP | 2012-142450 | 7/2012 |
| JP | 2013-153121 | 8/2013 |
| JP | 2014-067819 | 4/2014 |
| JP | 2015-032807 | 2/2015 |
| WO | WO 03/105160 | 12/2003 |

* cited by examiner

No. 2        No. 3

No. 4        No. 5

US 10,887,988 B2

CIRCUIT SUBSTRATE, COMPONENT-MOUNTED SUBSTRATE, AND METHODS OF MANUFACTURING CIRCUIT SUBSTRATE AND COMPONENT-MOUNTED SUBSTRATE

CROSS-REFERENCE TO RELATED APPLICATIONS

The present application claims priority under 35 U.S.C. § 119 to Japanese Patent Application No. 2018-180393, filed Sep. 26, 2018, the contents of which are hereby incorporated by reference in their entirety.

BACKGROUND

Field of the Invention

The present disclosure relates to a circuit substrate, a component-mounted substrate, and methods of manufacturing the circuit substrate and the component-mounted substrate.

Description of the Related Art

See, for example, Japanese Unexamined Patent Application Publication No. 7-176871, Japanese Unexamined Patent Application Publication No. 2008-108629, and Japanese Unexamined Patent Application Publication No. 10-190191

SUMMARY

The present disclosure advantageously sets forth a circuit substrate including a circuit pattern-provided insulating substrate including an insulating substrate and circuit patterns provided on a first surface and a second surface of the insulating substrate, where the circuit pattern-provided insulating substrate has a through-hole penetrating the insulating substrate and the circuit patterns. The circuit substrate further including an electrically conductive paste filled in the through-hole and electrically connected to the circuit patterns. The circuit patterns contain Cu as a main component. The electrically conductive paste is a melting-point shift electrically conductive paste including Sn—Bi solder powder, Cu powder, and resin. A diffusional reaction layer is provided where Cu included in the circuit patterns and Sn included in the electrically conductive paste cause a diffusional reaction in a portion where the electrically conductive paste and the circuit patterns are in contact with each other.

The present disclosure further advantageously sets forth a component-mounted substrate including a component mounted on the above circuit substrate.

The present disclosure advantageously sets forth a method of manufacturing a circuit substrate including forming, in an insulating substrate and circuit patterns that are provided on a first surface and a second surface of the insulating substrate, a through-hole penetrating the insulating substrate and the circuit patterns. The circuit patterns contain Cu as a main component. The method further includes filling, in the through-hole, an electrically conductive paste that is a melting-point shift electrically conductive paste including Sn—Bi solder powder, Cu powder, and resin, and forming a protrusion obtained by causing the electrically conductive paste to protrude from the through-hole. The method also includes performing pressure treatment on the protrusion near the through-hole, and performing heat treatment on the insulating substrate whose protrusion is subjected to the pressure treatment and causing the circuit patterns and the electrically conductive paste to be electrically connected with each other.

The present disclosure further advantageously sets forth a method of manufacturing a component-mounted substrate including forming resist on the first surface and the second surface of the circuit substrate manufactured with the method described above, and mounting a component on the circuit substrate formed with the resist.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

FIGS. 6B-A, 6B-B, and 6B-C show SEM images and images of energy dispersive X-ray spectrometry (EDX) analysis in the first working example;

DETAILED DESCRIPTION

An embodiment will be described below with reference to the drawings. Note that the embodiment described below is for exemplifying a circuit substrate, a component-mounted substrate, and methods of manufacturing the circuit substrate and the component-mounted substrate each for embodying a technical idea of the present embodiment, and is not limited to the following. Dimensions, materials, shapes, relative disposition, and the like of components described in the embodiment are not intended to limit the scope of the present invention to only those, and are merely illustration, unless otherwise specifically described. Note that sizes, positional relationships, and the like of members illustrated in each of the drawings may be exaggerated to clarify the description.

Circuit Substrate

First, a circuit substrate according to the present embodiment will be described below.

Figure 1A:
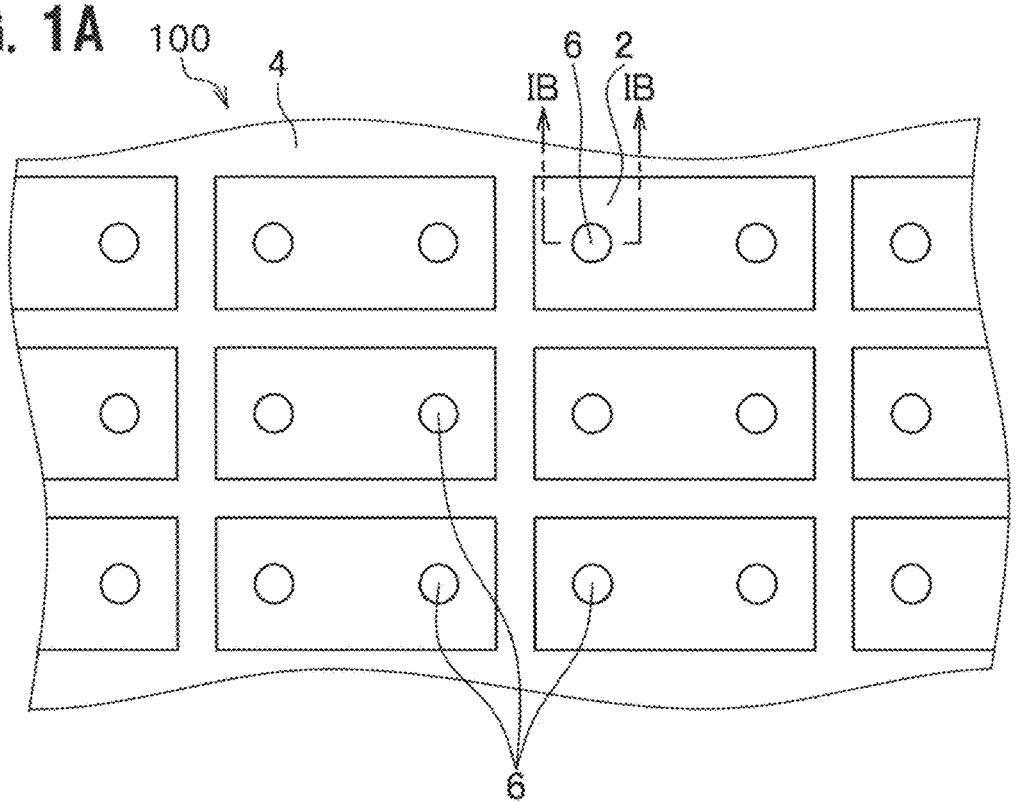
FIG. 1A is a schematic plan view illustrating a configuration of a circuit substrate according to an embodiment.
Figure 1B:
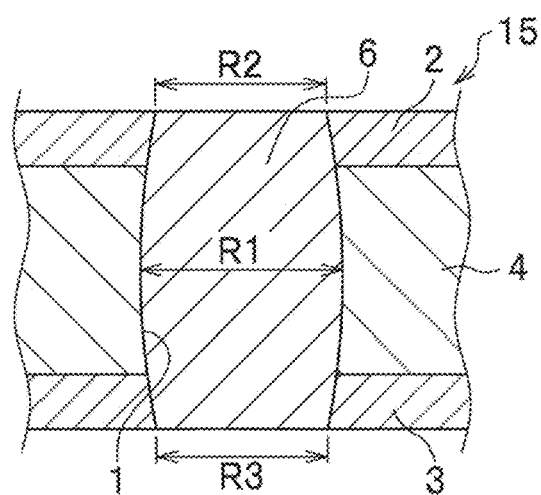
FIG. 1B is a schematic cross-sectional view illustrating the configuration of the circuit substrate according to the embodiment, and illustrates a cross section taken along line IB-IB in FIG. 1A.
Figure 1C:
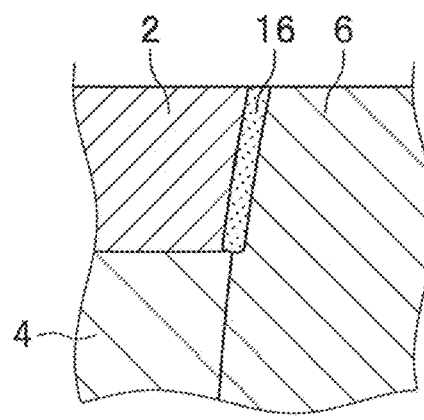
FIG. 1C is an enlarged partial schematic cross-sectional view illustrating a part of the configuration of the circuit substrate according to the embodiment.

FIG. 1A is a schematic plan view illustrating a configuration of the circuit substrate according to the embodiment. FIG. 1B is a schematic cross-sectional view illustrating the configuration of the circuit substrate according to the embodiment, and illustrates a cross section taken along line IB-IB in FIG. 1A. FIG. 1C is an enlarged partial schematic cross-sectional view illustrating a part of the configuration of the circuit substrate according to the embodiment (e.g., an upper left part of FIG. 1B showing an area where circuit pattern 2 is joined to electrically conductive paste 6).

A circuit substrate 100 includes a circuit pattern-provided insulating substrate 15 and an electrically conductive paste 6.

The circuit pattern-provided insulating substrate 15 includes an insulating substrate 4, a front-surface circuit pattern 2 provided on a front surface (also referred to herein as a first surface) of the insulating substrate 4, and a rear-surface circuit pattern 3 provided on a rear surface (also referred to herein as a second surface) of the insulating substrate 4. Through-holes 1 are formed for providing the electrically conductive paste 6 while penetrating the insulating substrate 4, the front-surface circuit pattern 2, and the rear-surface circuit pattern 3.

The insulating substrate 4 is formed from, for example, glass epoxy or a liquid crystal polymer. The glass epoxy is formed such that one or more pieces of glass cloth, nonwoven glass fabric, or the like are impregnated with a thermosetting insulating resin such as an epoxy resin, and then this thermosetting insulating resin is cured. Note that the insulating substrate 4 is generally manufactured as a double-sided copper clad laminated plate whose both surfaces are stuck with copper foil.

A thickness of the insulating substrate 4 is preferably 50 µm or more and 1000 µm or less. Setting the thickness of the insulating substrate 4 to 50 µm or more can improve strength of the insulating substrate 4. Setting the thickness of the insulating substrate 4 to 1000 µm or less can make the circuit substrate 100 thin. Setting the thickness of the insulating substrate 4 to 50 µm or more and 1000 µm or less makes it possible to surely fill the through-holes 1 with the electrically conductive paste 6.

Further, setting the thickness of the insulating substrate 4 to 50 µm or more and 300 µm or less makes it possible to impart flexibility. The thickness of the insulating substrate 4 is preferably 100 µm or more and 500 µm or less, and more preferably 150 µm or more and 400 µm or less.

A linear expansion coefficient of the insulating substrate 4 in a thickness direction is preferably 50 ppm or less. With the insulating substrate 4 whose linear expansion coefficient in the thickness direction is 50 ppm or less, flatness of the circuit substrate 100 can be improved, and therefore components are easily mounted on the circuit substrate 100. In addition, a dimensional variation of the electrically conductive paste 6 in a temperature cycle can be reduced, thereby improving connection reliability of the front-surface circuit pattern 2 and the rear-surface circuit pattern 3. Note that the linear expansion coefficient of the insulating substrate 4 in the thickness direction is around 35 ppm, for example.

The front-surface circuit pattern 2 is formed on the front surface of the insulating substrate 4. The rear-surface circuit pattern 3 is formed on the rear surface of the insulating substrate 4. The front-surface circuit pattern 2 and the rear-surface circuit pattern 3 are formed to be wired in desired shapes. The front-surface circuit pattern 2 and the rear-surface circuit pattern 3 are formed from a metal material, and contain Cu as a main component. The "main component" herein means a component in which Cu constitutes 70 mass % or more, preferably 80 mass % or more of a base material such as the front-surface circuit pattern 2.

Thicknesses of the front-surface circuit pattern 2 and the rear-surface circuit pattern 3 are preferably 12 µm or more and 70 µm or less. With the thicknesses of the front-surface circuit pattern 2 and the rear-surface circuit pattern 3 being 12 µm or more, the front-surface circuit pattern 2 and the rear-surface circuit pattern 3 are easily formed. In addition, connection resistance with the electrically conductive paste 6 can be reduced. In contrast, with the thicknesses of the front-surface circuit pattern 2 and the rear-surface circuit pattern 3 being 70 µm or less, the circuit substrate 100 can be made thin, and micro wiring can be formed.

The through-hole 1 is formed so as to penetrate the front-surface circuit pattern 2, the insulating substrate 4, and the rear-surface circuit pattern 3. For example, a diameter of the through-hole 1 is 0.2 mm or more and 0.3 mm or less.

Assuming that an identical unit is used, a value calculated by dividing the thickness of the front-surface circuit pattern 2 by a diameter of the through-hole 1 on the front surface of the insulating substrate 4 is preferably 0.075 or more and 0.25 or less. Also, assuming that an identical unit is used, a value calculated by dividing the thickness of the rear-surface circuit pattern 3 by the diameter of the through-hole 1 on the front surface of the insulating substrate 4 is preferably 0.075 or more and 0.25 or less.

With the above value being 0.075 or more, the connection resistance with the electrically conductive paste 6 can be reduced. In contrast, with the above value being 0.25 or less, high connection reliability can be obtained even with the thickness of the insulating substrate 4 being 1000 μm.

In the circuit substrate 100, in plan view at a portion formed with the through-hole 1, a diameter R1 at a center in the thickness direction is larger than a diameter R2 at a portion formed on the front surface of the insulating substrate 4 and a diameter R3 at a portion formed on the rear surface of the insulating substrate 4. In other words, in the through-hole 1 formed in the circuit substrate 100, the diameter R1 of the center of the hole in the thickness direction is larger than the diameter R2 of a first hole opening and the diameter R3 of a second hole opening. In a hole shape of the through-hole 1, the diameter R1 of the center in the hole is larger than the diameters R2, R3 of the hole openings, whereby the electrically conductive paste 6 filled in the through-hole 1 is formed into a barrel shape.

With the barrel shape, the electrically conductive paste 6 filled in the through-hole 1 is compressed with higher density, whereby the diameter R1 of the center of the hole is different in value from the diameters R2, R3 of the hole openings. With such a shape, density of the electrically conductive paste 6 is further increased, thereby decreasing a resistance value of an interlayer connection member formed from the electrically conductive paste 6. A void is collapsed and lost upon being compressed, whereby the void is hardly produced in the interlayer connection member.

In the through-hole 1 formed in the circuit substrate 100, the diameter R1 of the center of the hole in the thickness direction is preferably larger than the diameter R2 of the first hole opening and the diameter R3 of the second hole opening by 3% or more. With this configuration, the density of the electrically conductive paste 6 is further increased, thereby decreasing the resistance value of the interlayer connection member. In addition, the void is hardly produced in the interlayer connection member. Note that an upper limit in size of the diameter R1 of the center in the hole relative to the diameters R2, R3 of the hole openings can be around 7.5%, for example.

Note that as long as the electrically conductive paste 6 in the through-hole 1 is compressed, the diameters R2, R3 of the hole openings can be the same as the diameter R1 of the center in the hole. Also, with such a configuration, the density of the electrically conductive paste 6 is increased, thereby decreasing the resistance value of the interlayer connection member. A void is collapsed and lost upon being compressed, whereby the void is hardly produced in the interlayer connection member.

The electrically conductive paste 6 is filled in the through-hole 1, and electrically connected to the front-surface circuit pattern 2 and the rear-surface circuit pattern 3. The electrically conductive paste 6 is a portion that electrically connects the front-surface circuit pattern 2 to the rear-surface circuit pattern 3. The electrically conductive paste 6 filled in the through-hole 1 serves as the interlayer connection member. The interlayer connection member is formed by filling the electrically conductive paste 6 in the through-hole 1, thereby improving connection reliability against thermal impact in mounting of a component, for example.

Upon being manufactured, for example, the electrically conductive paste 6 is compressed in the through-hole 1 by performing pressure treatment on a protrusion obtained by causing the electrically conductive paste 6 to protrude from the through-hole 1, as will be described later.

As the electrically conductive paste 6, a melting-point shift type electrically conductive paste including Sn—Bi solder powder, Cu powder, and resin is used. By using such an electrically conductive paste 6, as will be described later, Cu included in the front-surface circuit pattern 2 and the rear-surface circuit pattern 3 and Sn included in the electrically conductive paste 6 cause diffusional reaction. Herein, the wording "melting-point shift type" means a material in which, when a melting point of Cu alone is 1085° C., and a melting point of the Sn—Bi solder power is 140° C., after thermosetting treatment is performed, a melting point of the electrically conductive paste is hardly found at 140° C. in a next heat treatment step. In other words, in first heat treatment, the melting point of Sn—Bi solder is found and reactivity is high, and in second thermal treatment step, the melting point of Sn—Bi solder is not found, thereby improving the connection reliability and allowing a large current to flow.

It is preferable that the electrically conductive paste 6 contains 40 parts by mass or more and 60 parts by mass or less of the Sn—Bi solder powder, and 20 parts by mass or more and 35 parts by mass or less of the Cu powder, with respect to 100 parts by mass of the electrically conductive paste. With such an electrically conductive paste 6 used, the diffusional reaction can be further accelerated. Further, Sn and Bi each having an appropriate composition ratio can be added to the Sn—Bi solder powder. To adjust a linear expansion coefficient of the electrically conductive paste 6, powder of Ag, Fe, Ni, Zn, Al, Ti, and the like can be added. In the Sn—Bi solder powder, a mass ratio of Sn:Bi is preferably from 38:62 to 46:54, more preferably from 41:59 to 43:57.

Examples of resin included in the electrically conductive paste 6 include an epoxy resin, a modified epoxy resin, a glass epoxy resin, a silicone resin, a modified silicone resin, a polyolefin-based resin, a polycarbonate resin, a polystyrene resin, an acrylic resin, an acrylate resin, a methacrylic resin (e.g., polymethylmethacrylate (PMMA)), an urethane resin, a polyimide resin, a polynorbornene resin, and a fluororesin.

The circuit substrate 100 uses the electrically conductive paste 6 of the melting-point shift type including the Sn—Bi solder powder, the Cu powder, and the resin. After the electrically conductive paste 6 in the through-hole 1 is compressed, the insulating substrate 4 is heated. Accordingly Cu included in the front-surface circuit pattern 2 and the rear-surface circuit pattern 3 and Sn included in the electrically conductive paste 6 cause the diffusional reaction in a portion where the electrically conductive paste 6 is brought into contact with the front-surface circuit pattern 2 and the rear-surface circuit pattern 3, thereby forming a Cu—Sn alloy. With this configuration, electric connection between the electrically conductive paste 6 and the front-surface circuit pattern 2 as well as the rear-surface circuit pattern 3 is made satisfactory, and reliability against, for example, a cooling/heating cycle is made excellent. Furthermore, the connection resistance value of the interlayer connection member is decreased at the front surface and the rear surface of the circuit substrate 100, whereby a large current can be flown. Hence the circuit substrate 100 suitable for mounting of, for example, a light-emitting diode (LED) through which a large current continuously flows can be provided. Note that a portion 16, as shown in FIG. 1C, having caused the diffusional reaction can be formed into a layer to form a diffusional reaction layer.

As described above, in the present embodiment, the circuit substrate 100 includes the portion 16 where Cu included in the front-surface circuit pattern 2 and the rear-surface circuit pattern 3 and Sn included in the electrically conductive paste 6 have caused the diffusional reaction. With this configuration, the circuit substrate 100 allows a large current to flow.

Note that in the technique of Japanese Unexamined Patent Application Publication No. 7-176871, since a non-compressible porous substrate is used, resin included in the substrate is melted when being heated and compressed through hot pressing. Therefore, there is fear that an electrically conductive paste is deformed, which causes unstable connection.

Further, in the technique of Japanese Unexamined Patent Application Publication No. 2008-108629, an electrically conductive paste in a through-hole easily includes bubbles, whereby there is fear of lowering reliability. In addition, since the electrically conductive paste is printed on Cu foil on a front surface and a rear surface including the through-hole, flatness is degraded, whereby there is fear that reliability upon mounting components is unsatisfactory.

Further, in the technique of Japanese Unexamined Patent Application Publication No. 10-190191, through-holes are provided in a substrate, an electrically conductive paste is filled in the through-holes, and copper foil that is separately prepared and is already etched is pressured and compressed to be embedded in the substrate, thereby achieving stable connection. With this technique, alignment of three kinds of materials that are the copper foil on a front surface, the copper foil on a rear surface, and the electrically conductive paste is difficult, and when an area of the copper foil becomes wide, the copper foil is difficult to be embedded in a resin substrate, whereby connection stability is affected by design, in some cases.

Requirements for circuit substrates from recent customers have been more sever year by year. Particularly for circuit substrates for LEDs, highly reliable substrates allowing a large current to flow have been demanded. Hence multilayer substrates having a conventional connection structure have failed to satisfy such requirements.

In the present embodiment, the circuit substrate 100 includes the portion 16 having caused the diffusional reaction, whereby a large current can flow. Further since the circuit substrate 100 is unnecessary to use an uncured insulating substrate, a shape of the electrically conductive paste 6 filled in the through-hole 1 can be stabilized, and the density of the electrically conductive paste 6 is increased, thereby reducing and stabilizing the resistance value of the interlayer connection member.

Method of Manufacturing Circuit Substrate

Next, an example of a method of manufacturing the circuit substrate according to the present embodiment will be described below.

Figure 2:
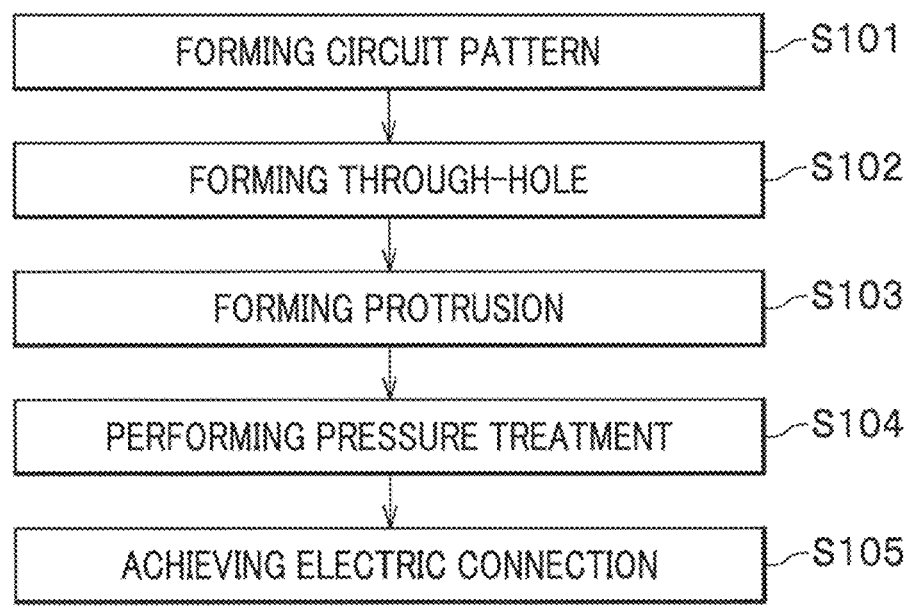
FIG. 2 is a schematic flowchart of a method of manufacturing the circuit substrate according to the embodiment.
Figure 3A:
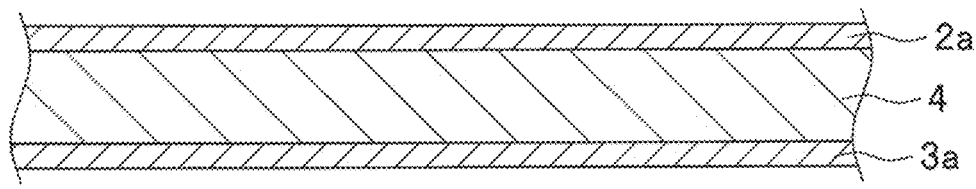
FIG. 3A is a schematic cross-sectional view illustrating a state before a circuit pattern is formed, in the method of manufacturing the circuit substrate according to the embodiment.
Figure 3B:
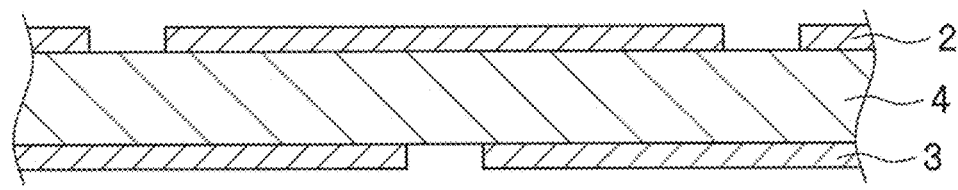
FIG. 3B is a schematic cross-sectional view illustrating forming the circuit pattern, in the method of manufacturing the circuit substrate according to the embodiment.
Figure 3C:
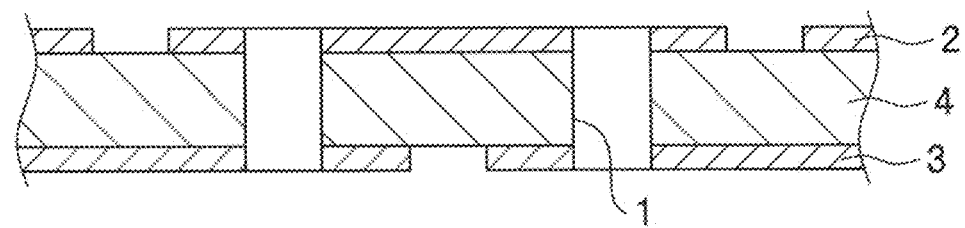
FIG. 3C is a schematic cross-sectional view illustrating forming a through-hole, in the method of manufacturing the circuit substrate according to the embodiment.
Figure 3D:
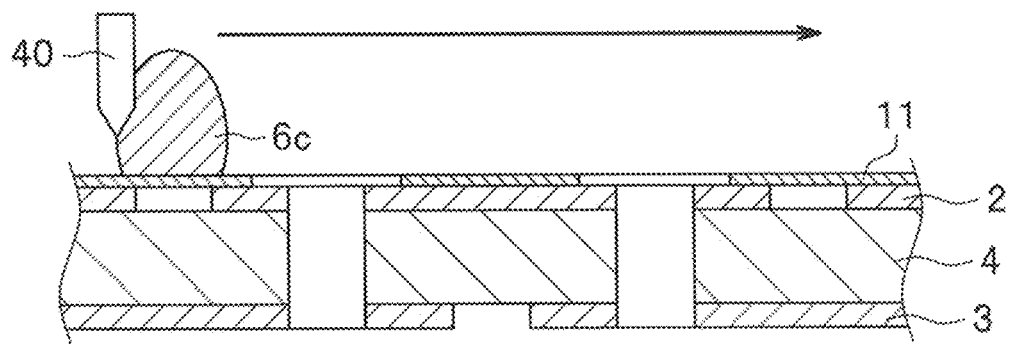
FIG. 3D is a schematic cross-sectional view illustrating forming a protrusion, in the method of manufacturing the circuit substrate according to the embodiment, and is a schematic cross-sectional view illustrating filling the through-hole with an electrically conductive paste.
Figure 3E:
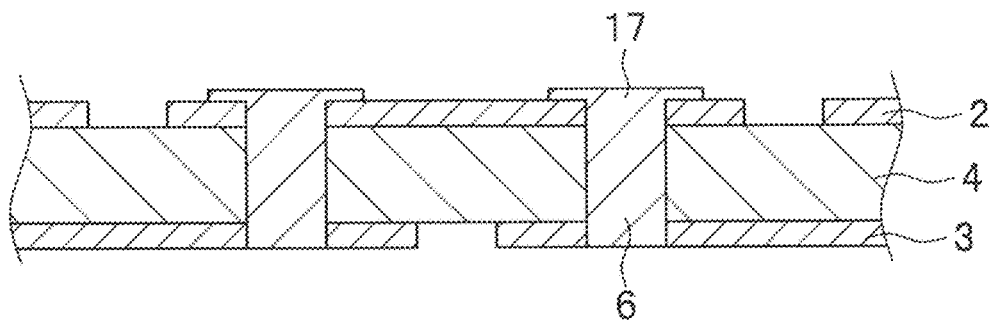
FIG. 3E is a schematic cross-sectional view illustrating the forming the protrusion, in the method of manufacturing the circuit substrate according to the embodiment, and is a schematic cross-sectional view illustrating a state in which the protrusion is formed.
Figure 3F:
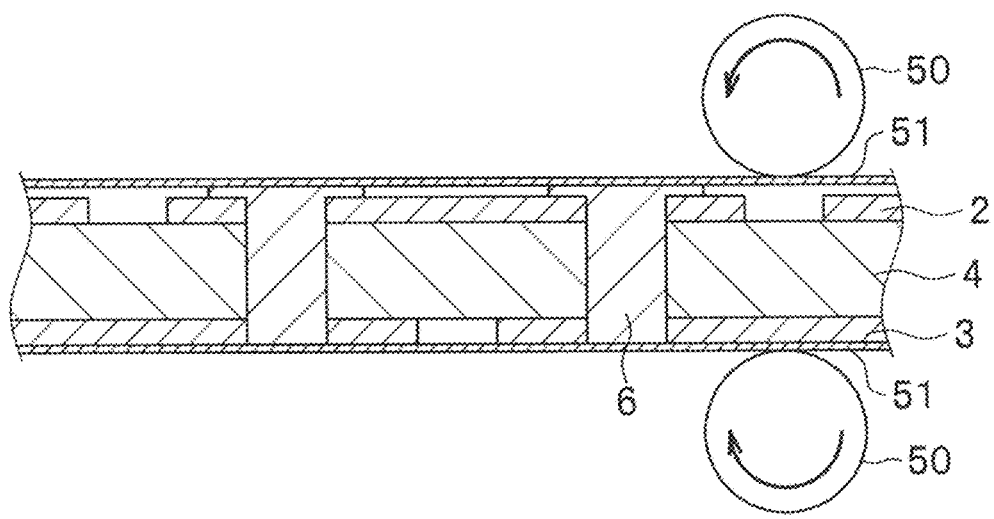
FIG. 3F is a schematic cross-sectional view illustrating performing pressure treatment on the protrusion, in the method of manufacturing the circuit substrate according to the embodiment.
Figure 3G:
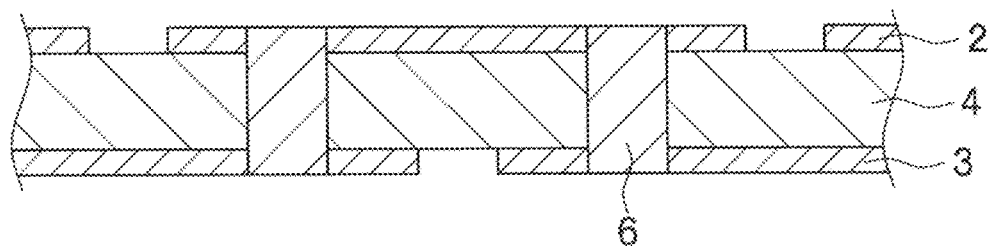
FIG. 3G is a schematic cross-sectional view illustrating a state after the pressure treatment is performed on the protrusion, in the method of manufacturing the circuit substrate according to the embodiment.

FIG. 2 is a schematic flowchart of the method of manufacturing the circuit substrate according to the embodiment. FIG. 3A is a schematic cross-sectional view illustrating a state before a circuit pattern is formed, in the method of manufacturing the circuit substrate according to the embodiment. FIG. 3B is a schematic cross-sectional view illustrating forming the circuit pattern, in the method of manufacturing the circuit substrate according to the embodiment. FIG. 3C is a schematic cross-sectional view illustrating forming a through-hole, in the method of manufacturing the circuit substrate according to the embodiment. FIG. 3D is a schematic cross-sectional view illustrating forming a protrusion, in the method of manufacturing the circuit substrate according to the embodiment, and is a schematic cross-sectional view illustrating filling the through-hole with an electrically conductive paste. FIG. 3E is a schematic cross-sectional view illustrating forming the protrusion, in the method of manufacturing the circuit substrate according to the embodiment, and is a schematic cross-sectional view illustrating a state in which the protrusion is formed. FIG. 3F is a schematic cross-sectional view illustrating performing pressure treatment on the protrusion, in the method of manufacturing the circuit substrate according to the embodiment. FIG. 3G is a schematic cross-sectional view illustrating a state after the pressure treatment is performed on the protrusion, in the method of manufacturing the circuit substrate according to the embodiment.

The method of manufacturing the circuit substrate according to the present embodiment includes a step S101 of forming a circuit pattern, a step S102 of forming a through-hole, a step S103 of forming a protrusion, a step S104 for performing pressure treatment, and a step S105 of achieving electric connection. Note that materials, disposition, and the like of members are the same as those described in the circuit substrate 100, and therefore the description thereof is omitted herein as appropriate.

Forming Circuit Pattern

The step S101 of forming the circuit pattern includes forming the front-surface circuit pattern 2 and the rear-surface circuit pattern 3 on the front surface and the rear surface of the insulating substrate 4, respectively.

In step S101, for example, a commercially-available double-sided copper clad laminated plate is first prepared. The commercially-available double-sided copper clad laminated plate is formed such that one or more sheets of glass cloth are impregnated with an epoxy resin, front-surface copper foil 2a and rear-surface copper foil 3a are bonded on a front surface and a rear surface of the glass cloth, respectively, and the epoxy resin is then cured. Next, etching is performed on the front-surface copper foil 2a and the rear-surface copper foil 3a to form the front-surface circuit pattern 2 and the rear-surface circuit pattern 3, respectively.

Note that instead of using the commercially-available double-sided copper clad laminated plate, the front-surface copper foil 2a and the rear-surface copper foil 3a can be bonded on a front surface and a rear surface of the insulating substrate 4, respectively. Alternatively, a double-sided copper clad laminated plate formed with the front-surface circuit pattern 2 and the rear-surface circuit pattern 3 in advance can be purchased.

Forming Through-Hole

The step S102 of forming the through-hole includes forming, in the insulating substrate 4, the front-surface circuit pattern 2 that is disposed on the front surface of the insulating substrate 4 and contains Cu as a main component, and the rear-surface circuit pattern 3 that is disposed on the rear surface of the insulating substrate 4 and contains Cu as a main component, a through-hole 1 that penetrates the insulating substrate 4, the front-surface circuit pattern 2, and the rear-surface circuit pattern 3.

In step S102, drilling with a drill or punching is performed on a portion where the front-surface circuit pattern 2 and the rear-surface circuit pattern 3 are present in the insulating substrate 4 from, for example, a front-surface side of the insulating substrate 4, to form the through-hole 1.

Forming Protrusion

The step S103 of forming the protrusion is a step in which the melting-point shift type electrically conductive paste 6 including the Sn—Bi solder powder, the Cu powder, and the resin is filled in the through-hole 1, to form a protrusion 17 obtained by causing the electrically conductive paste 6 to protrude from the through-hole 1.

To form the protrusion 17, before the electrically conductive paste 6 is filled in the through-hole 1, a coating member 11 is provided on the insulating substrate 4, thereby forming a step difference with the front-surface circuit pattern 2. After the electrically conductive paste 6 is filled in the through-hole 1, the coating member 11 is peeled off. This forms the protrusion 17 obtained by causing the electrically conductive paste 6 to protrude from the through-hole 1 by a thickness of the coating member 11 on the front surface of the insulating substrate 4. As the coating member 11, any one of a metal mask, a screen mask, and an insulation film is used, for example.

In step S103, for example, the electrically conductive paste 6c is first filled in the through-hole 1 from the front surface of the insulating substrate 4 through the coating member 11 with screen printing. Conditions of the screen printing are described as follows, for example. A clearance is set to 0 mm or more and 2 mm or less. A metal mask (coating member 11) whose thickness is 20 μm or more and 60 μm or less, and whose opening hole diameter φ is 0.2 mm or more and 0.5 mm or less, or a screen mask (coating member 11) whose mesh number is 150 or more and 400 or less, and whose emulsion thickness is 5 μm or more and 20 μm or less, and squeegee 40 formed from urethane rubber whose hardness is 70 or more and 80 or less are used. One-way printing with the squeegee is performed with an effective squeegee angle of 15 degrees or more and 30 degrees or less, applied pressure of 0.2 MPa or more and 0.4 MPa or less, and a squeegee speed of 10 mm/sec or more and 50 mm/sec or less. The coating member 11 is then peeled off. In this manner, the protrusion 17 is formed which is obtained by causing the electrically conductive paste 6 to protrude from the through-hole 1 by the thickness of the coating member 11.

Note that instead of the metal mask or the screen mask, an insulation film whose thickness is 5 μm or more and 60 μm or less, can be used. When the insulation film is used, before the through-hole 1 is formed, the insulation film is bonded on a front-surface side of the circuit pattern-provided insulating substrate 15, and then the through-hole 1 that penetrates the insulation film, the insulating substrate 4, the front-surface circuit pattern 2, and the rear-surface circuit pattern 3 can be formed.

Note that in view of easily filling an electrically conductive paste 6c in the through-hole 1, squeegee reciprocation printing can be performed. Alternatively, the electrically conductive paste 6c can be filled in the through-hole 1 with a direct squeegeeing method. However, in view of easily forming the protrusion 17, any one of the metal mask, the screen mask, and the insulation film is preferably used.

In step S103, the protrusion 17 is preferably formed such that a thickness of the protrusion 17 is 5% or more and 20% or less relative to a thickness of the insulating substrate 4. With the thickness of the protrusion 17 being 5% or more relative to the thickness of the insulating substrate 4, the electrically conductive paste 6 filled in the through-hole 1 can easily be compressed with higher density in a step to be described later. In contrast, with the thickness of the protrusion 17 being 20% or less relative to the thickness of the insulating substrate 4, the electrically conductive paste 6 filled in the through-hole 1 can be compressed more appropriately.

In step S103, the protrusion 17 is preferably formed such that a height from a surface of the front-surface circuit pattern 2 to a surface of the protrusion 17 is 15 μm or more. With the height from the front surface of the front-surface circuit pattern 2 to the surface of the protrusion 17 being 15 μm or more, the electrically conductive paste 6 filled in the through-hole 1 can easily be compressed with higher density. In view of more appropriate compression of the electrically conductive paste 6 filled in the through-hole 1, the height from the front surface of the front-surface circuit pattern 2 to the surface of the protrusion 17 is preferably 60 μm or less.

Performing Pressure Treatment

The step S104 of performing the pressure treatment includes performing the pressure treatment on the protrusion 17 in the vicinity of the through-hole 1. The vicinity of the through-hole 1 is, for example, a portion where the electrically conductive paste 6 on the insulating substrate 4 is present in a periphery of the through-hole 1.

In step S104, for example, the protrusion 17 is subjected to the pressure treatment by pressuring the insulating substrate 4 with heated rolls 50 through separators 51 such as paper from both surfaces of the insulating substrate 4. This pressure treatment compresses the electrically conductive paste 6 filled in the through-hole 1.

In step S104, a heating temperature is preferably 60° C. or more and 130° C. or less. With the heating temperature being 60° C. or more, the electrically conductive paste 6 is softened, and therefore the protrusion 17 is easily pressured. In contrast, with the heating temperature being 130° C. or less, energy for heating can be saved, which is economical.

For example, the pressure for the pressure treatment can be 1 MPa or more and 6 MPa or less. Note that, when Al plates are placed on the both surfaces of the insulating substrate 4, and the insulating substrate 4 is pressured with the heated rolls 50 through the Al plates, the resistance value of the interlayer connection member is further lowered and stabilized.

Achieving Electric Connection

Step S105 of achieving electrical connection is a process in which the insulating substrate 4 with the protrusion 17 being subjected to the pressure treatment is subjected to heat treatment, to electrically connect the front-surface circuit pattern 2 and the rear-surface circuit pattern 3 to the electrically conductive paste 6.

With step S105, Cu included in the front-surface circuit pattern 2 and the rear-surface circuit pattern 3 and Sn included in the electrically conductive paste 6 cause the diffusional reaction, to be alloyed.

In step S105, a heat-treatment temperature is preferably 180° C. or more and 280° C. or less. With the heat-treatment temperature being 180° C. or more, the diffusional reaction is easily accelerated. In contrast, with the heat-treatment temperature being 280° C. or less, a load imposed on the insulating substrate 4 can be reduced. Note that, for example, the heat-treatment time can be set to 3 minutes or more and 60 minutes or less.

In step S105, the heat treatment is preferably performed in a nitrogen atmosphere. With the heat treatment being performed in the nitrogen atmosphere, the diffusional reaction is easily accelerated.

Component-Mounted Substrate

Next, the component-mounted substrate according to the present embodiment will be described below.

Figure 4:
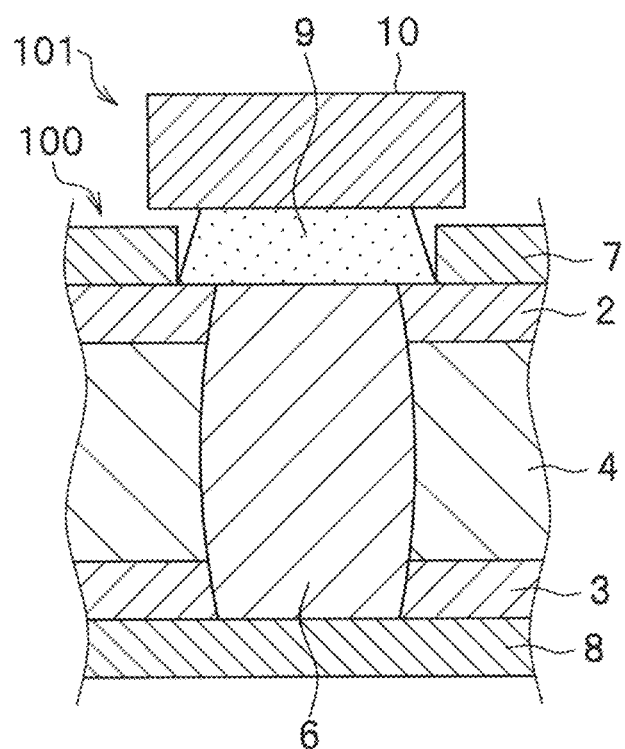
FIG. 4 is a schematic cross-sectional view illustrating a configuration of a component-mounted substrate according to the embodiment.

FIG. 4 is a schematic cross-sectional view illustrating a configuration of the component-mounted substrate according to the embodiment.

A component-mounted substrate 101 is the circuit substrate 100 with a component 10 mounted thereon.

The component-mounted substrate 101 includes the circuit substrate 100, front-surface resist 7 disposed in a partial region on the front surface of the circuit substrate 100, rear-surface resist 8 disposed on the rear surface of the circuit substrate 100, and the component 10 provided on the electrically conductive paste 6 on the front surface of the circuit substrate 100 through an adhesion layer 9 that is a solder paste.

The front-surface resist 7 is solder resist, and is formed in a periphery of the component 10. In other words, the front-surface resist 7 is disposed on the front-surface circuit pattern 2 excluding the electrically conductive paste 6 and the vicinity thereof. The rear-surface resist 8 is solder resist, and is formed so as to cover the rear-surface circuit pattern 3 and the electrically conductive paste 6.

As the front-surface resist 7 and the rear-surface resist 8, for example, a general material in which a copolymer resin such as epoxy is mixed with a solution, an antifoam agent, and the like, or a material that is added with filler such as titanium oxide and is whitened can be used. Note that the front-surface resist 7 and the rear-surface resist 8 serve as insulation layers. Each of thickness of the front-surface resist 7 and the rear-surface resist 8 is, for example, 10 μm or more and 30 μm or less. Thicknesses of the front-surface resist 7 and the rear-surface resist 8 can be identical to each other, or can be different from each other.

As a material of the adhesion layer 9, for example, Sn—Ag—Cu, Au, Ag, Cu, Sn, Bi, and an alloy thereof can be used. Examples of the component 10 include an LED, a chip resister, and a capacitor.

Method of Manufacturing Component-Mounted Substrate

Next, a method of manufacturing the component-mounted substrate according to the present embodiment will be described below.

Figure 5A:
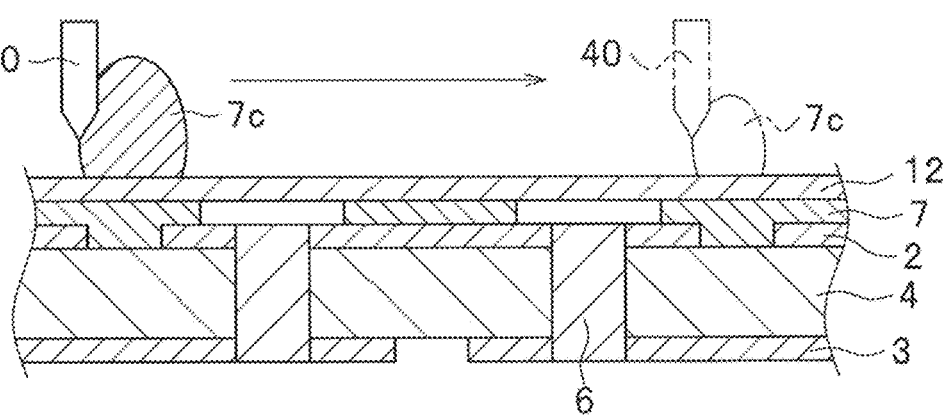
FIG. 5A is a schematic cross-sectional view illustrating forming resist in a method of manufacturing the component-mounted substrate according to the embodiment, and is a schematic cross-sectional view illustrating the forming of the resist on a front surface of the circuit substrate.
Figure 5B:
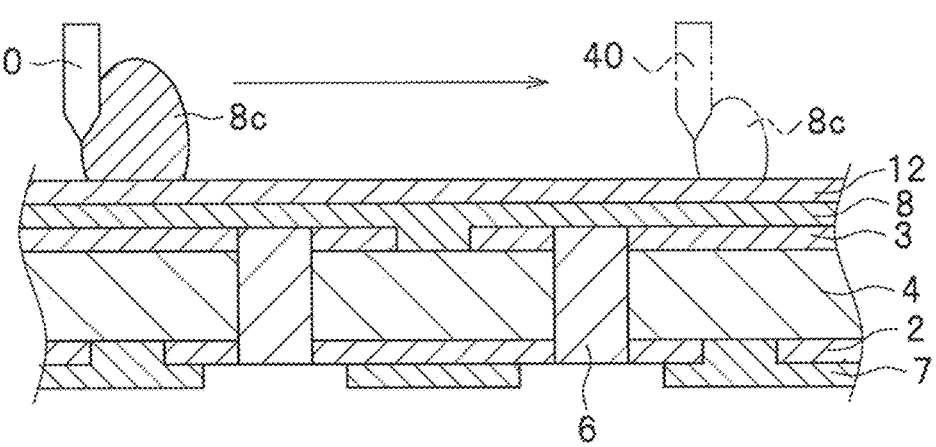
FIG. 5B is a schematic cross-sectional view illustrating the forming of the resist in the method of manufacturing the component-mounted substrate according to the embodiment, and is a schematic cross-sectional view illustrating the forming of the resist on a rear surface of the circuit substrate.
Figure 5C:
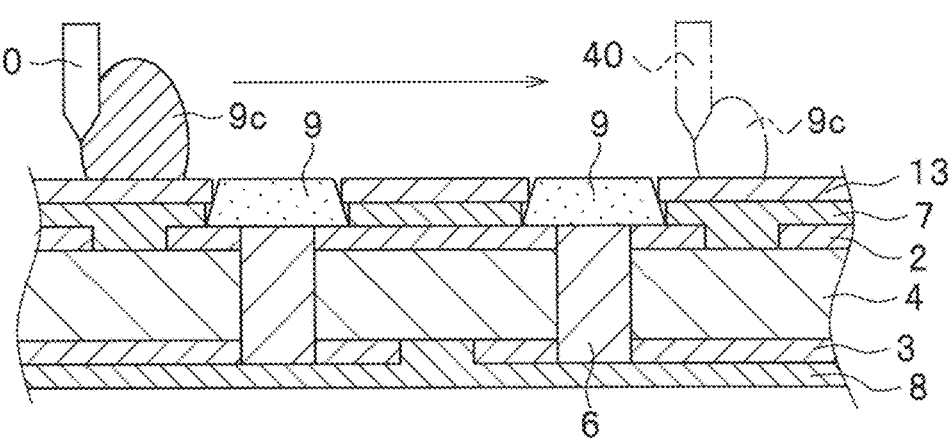
FIG. 5C is a schematic cross-sectional view illustrating mounting a component in the method of manufacturing the component-mounted substrate according to the embodiment, and is a schematic cross-sectional view illustrating forming an adhesion layer.
Figure 5D:
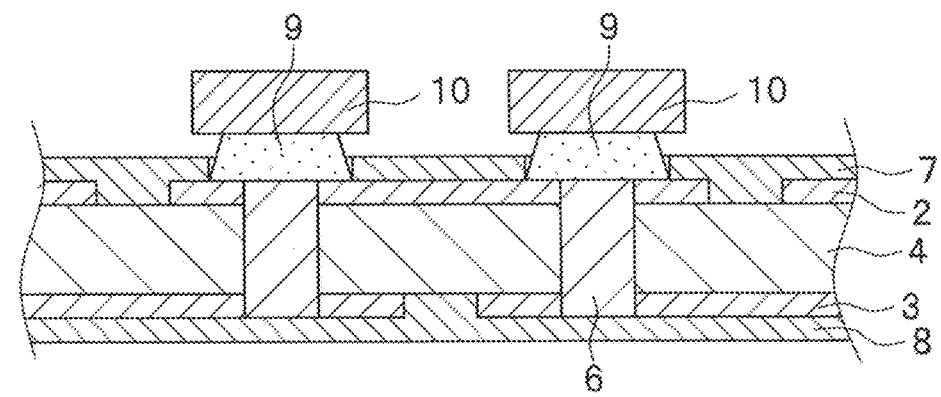
FIG. 5D is a schematic cross-sectional view illustrating the mounting of the component in the method of manufacturing the component-mounted substrate according to the embodiment, and is a schematic cross-sectional view illustrating a state after the component is mounted.

FIG. 5A is a schematic cross-sectional view illustrating forming of the resist in the method of manufacturing the component-mounted substrate according to the embodiment, and is a schematic cross-sectional view illustrating the forming of the resist on the front surface of the circuit substrate. FIG. 5B is a schematic cross-sectional view illustrating forming of the resist in the method of manufacturing the component-mounted substrate according to the embodiment, and is a schematic cross-sectional view illustrating the forming of the resist on the rear surface of the circuit substrate. FIG. 5C is a schematic cross-sectional view illustrating mounting a component in the method of manufacturing the component-mounted substrate according to the embodiment, and is a schematic cross-sectional view illustrating forming an adhesion layer. FIG. 5D is a schematic cross-sectional view illustrating mounting of the component in the method of manufacturing the component-mounted substrate according to the embodiment, and is a schematic cross-sectional view illustrating a state after the component is mounted.

Note that in each step, the squeegee or the mask is attached with an identical number, but it means that a physically identical article is not necessarily used, but articles whose functions or properties are common are used, for example. Articles having, for example, different sizes or different materials from each other can be used.

The method of manufacturing the component-mounted substrate according to the present embodiment includes, for example, forming of the resist on the circuit substrate described above and mounting of the component, and performs those steps in this order. Note that materials, disposition, and the like of members are the same as those described in the component-mounted substrate, and therefore the description thereof is omitted herein as appropriate. Note that, in FIG. 5B, an orientation of the circuit substrate is vertically reversed from those in FIG. 5C and FIG. 5D.

Forming Resist

The forming of the resist includes forming the front-surface resist 7 and the rear-surface resist 8 on the front surface and the rear surface of the circuit substrate 100, respectively. Herein, the front-surface resist 7 and the rear-surface resist 8 are formed in order of the front surface and the rear surface of the circuit substrate 100, but the rear-surface resist 8 and the front-surface resist 7 can be formed in order of the rear surface and the front surface of the circuit substrate 100.

In this step, first, the front-surface resist 7 is formed, with the screen printing, on the front-surface circuit pattern 2 of the circuit substrate 100, using a screen mask 12 on which a desirable application pattern is formed and a front-surface resist 7c.

Conditions of the screen printing are described as follows, for example. A clearance is set to 0.5 mm or more and 5.0 mm or less. Screen mask 12 whose mesh number is 100 or more and 400 or less, and whose emulsion thickness is 10 μm or more and 20 μm or less, and squeegee 40 formed from urethane rubber whose hardness is 60 or more and 80 or less, are used. One-way printing with the squeegee is performed with an effective squeegee angle of 60 degrees or more and 80 degrees or less, applied pressure of 0.2 MPa or more and 0.4 MPa or less, and a squeegee speed of 20 mm/sec or more and 100 mm/sec or less. The front-surface resist 7 is then heated at a temperature of 50° C. or more and 250° C. or less, for a time of 5 minutes or more and 60 minutes or less, to be cured.

Next, the rear-surface resist 8 is formed, with the screen printing, on the rear-surface circuit pattern 3, using the screen mask 12 and a rear-surface resist 8c. The rear-surface resist 8c is the same as the resist printed and formed from the front surface of the insulating substrate 4. The conditions of the screen printing are the same as the conditions with which the front-surface resist 7 is printed and formed. The rear-surface resist 8 is then heated at a temperature of 50° C. or more and 250° C. or less, for a time of 5 minutes or more and 60 minutes or less, to be cured. The insulation layer is thus formed on desired ranges of the front-surface circuit pattern 2 and the rear-surface circuit pattern 3.

Mounting Component

The mounting of the component includes mounting the component on the circuit substrate 100 formed with the front-surface resist 7 and the rear-surface resist 8.

In this step, first, a solder paste 9c is printed using a metal mask 13 in which an opening is provided at a component mounting portion, and a squeegee 40, to form the adhesion layer 9. Next, the component 10 is loaded on the adhesion layer 9, and the adhesion layer 9 is cured to connect and fix the component 10 to the circuit substrate 100.

In this example, the solder paste 9c is directly applied on the electrically conductive paste 6, but in view of bonding strength of the component, the component mounting portion can be subjected to plating or organic passivation in advance.

Hereinafter, working examples will be described.

Figure 6A:
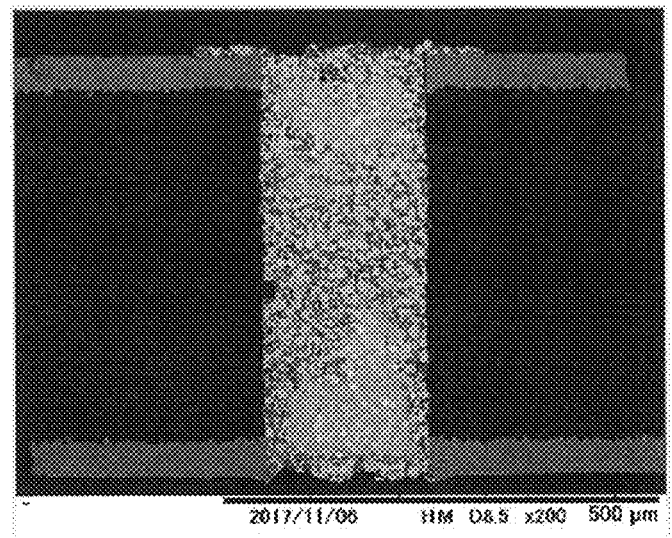
FIG. 6A shows a scanning electron microscope (SEM) image of a cross section of a circuit substrate in a first working example.
Figure 6B:
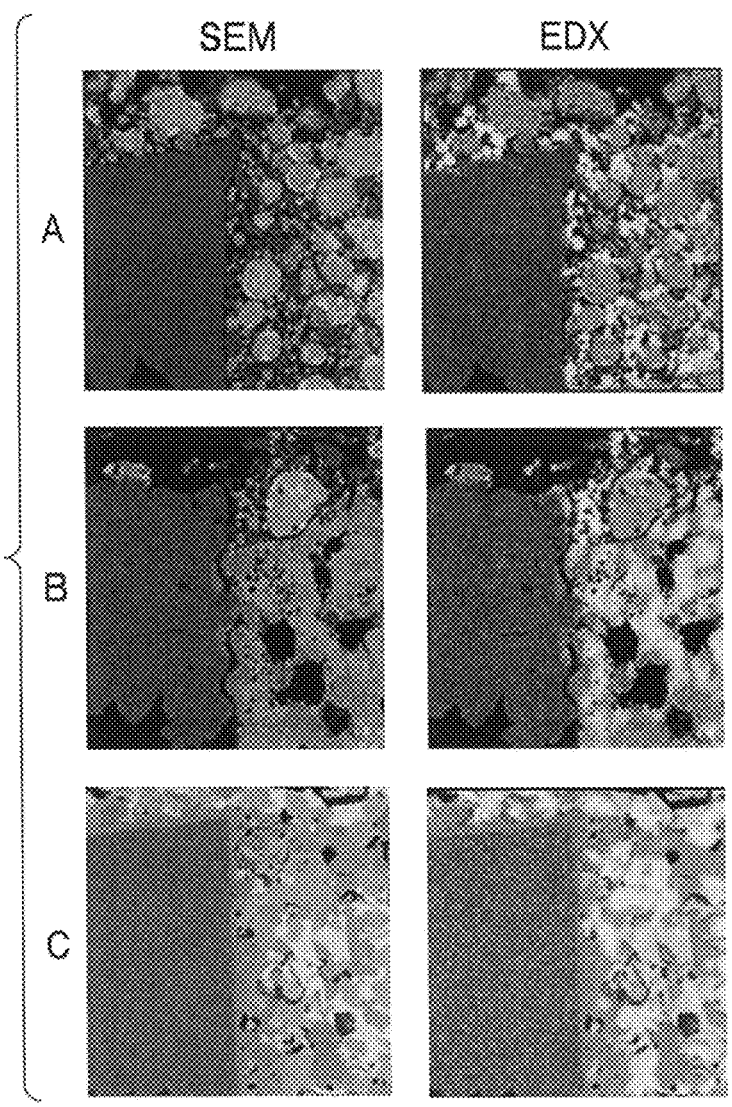
Figure 7A:
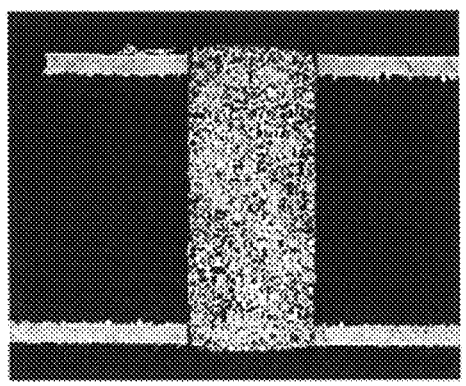
FIG. 7A shows images of cross sections of circuit substrates of working examples in a second working example.
Figure 7A:
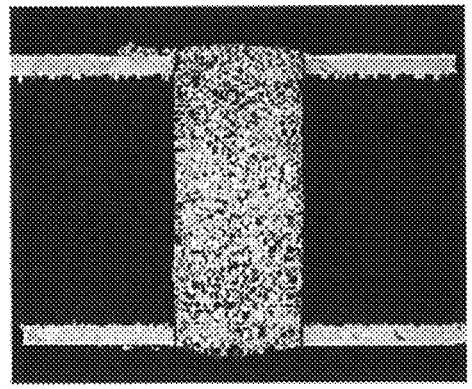
Figure 7B:
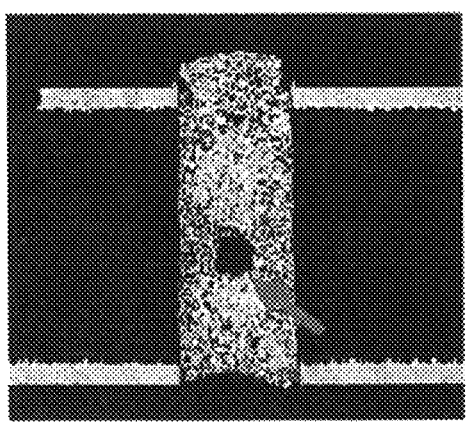
FIG. 7B shows images of cross sections of circuit substrates of comparative examples in the second working example.
Figure 7B:
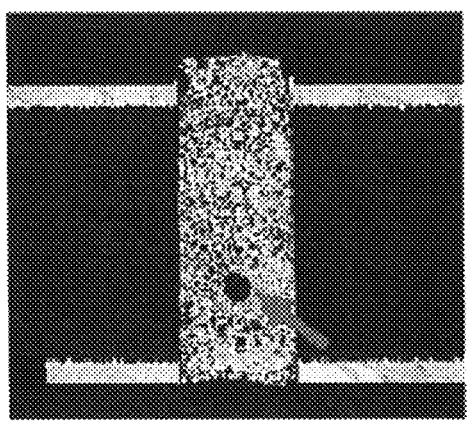
Figure 8A:
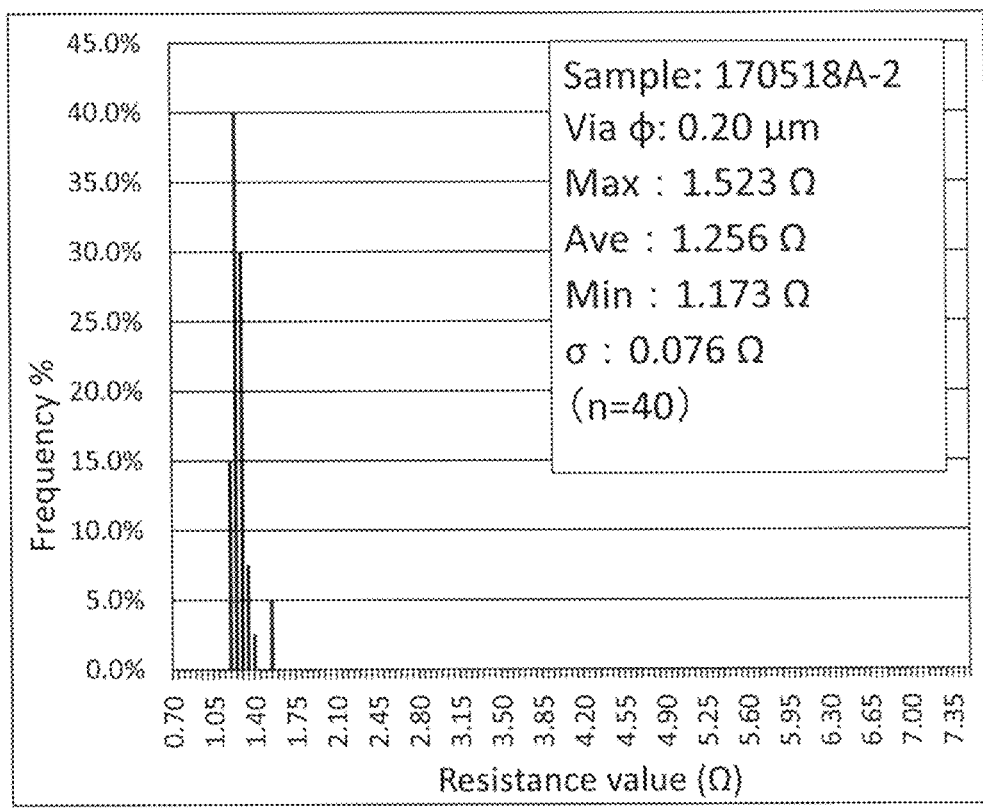
FIG. 8A is a schematic graph of a resistance-value histogram of a working example in a third working example.
Figure 8B:
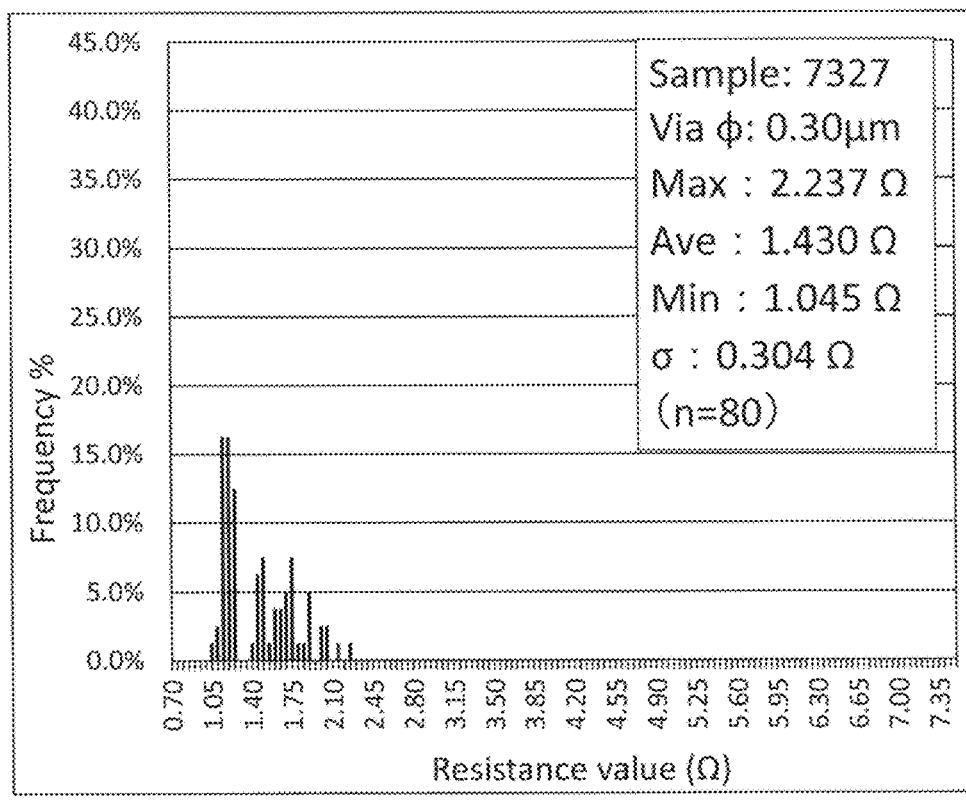
FIG. 8B is a schematic graph of a resistance-value histogram of a comparative example in the third working example.
Figure 8C:
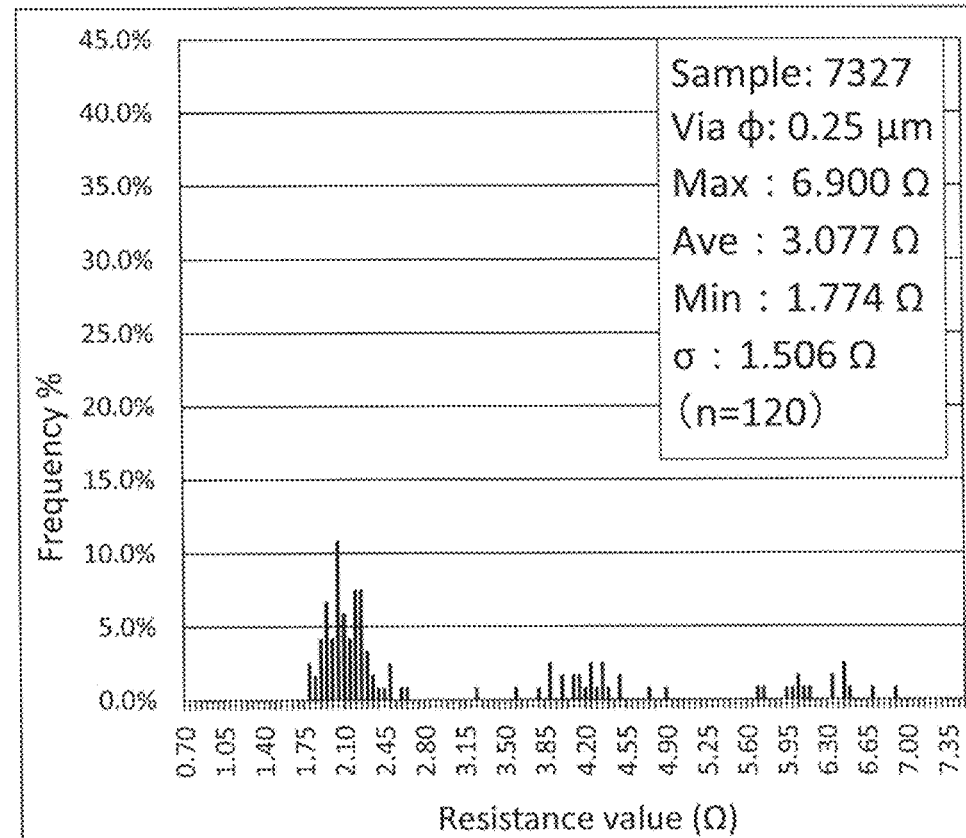
FIG. 8C is a schematic graph of a resistance-value histogram of a comparative example in the third working example.

FIG. 6A shows a SEM image of a cross section of a circuit substrate in a first working example. FIGS. 6B-A, 6B-B, and 6B-C show SEM images and images of EDX analysis in the first working example. FIG. 7A shows images of cross sections of circuit substrates of working examples in a second working example. FIG. 7B shows images of cross sections of circuit substrates of comparative examples in the second working example. FIG. 8A is a schematic graph of a resistance-value histogram of a working example in a third working example. FIG. 8B is a schematic graph of a resistance-value histogram of a comparative example in the third working example. FIG. 8C is a schematic graph of a resistance-value histogram of a comparative example in the third working example.

First Working Example

The circuit substrates were made in the following manner.
Sample No. 1

First, copper foil whose thickness is 35 µm was bonded on a front surface and a rear surface of an insulating substrate (glass epoxy) whose thickness is 400 µm and whose linear expansion coefficient in a thickness direction is around 35 ppm, to cause a total thickness of the circuit substrate at an interlayer connection member to be 470 µm. Next, etching was performed on the copper foil on the both surfaces to form a front-surface circuit pattern and a rear-surface circuit pattern. Next, drilling was performed from a front-surface side of the insulating substrate to form a through-hole whose diameter φ is 0.2 mm.

Next, an electrically conductive paste was filled in the through-hole from the front surface of the insulating substrate through a coating member with the screen printing. Conditions of the screen printing are described as follows. A clearance is set to 0 mm or more and 1 mm or less. A metal mask whose thickness is 20 µm or more and 60 µm or less, and whose opening hole diameter φ is 250 µm and a squeegee formed from urethane rubber whose hardness is 80 are used. One-way printing with the squeegee is performed with an effective squeegee angle being 15 degrees, applied pressure being 0.3 MPa, and a squeegee speed being 50 mm/sec. The metal mask is then peeled off.

The electrically conductive paste contained 55 parts by mass of the Sn—Bi solder powder, and 30 parts by mass of the Cu powder, and in addition the resin, with respect to 100 parts by mass of the electrically conductive paste.

Next, with a heating temperature being 120° C. and pressure being 2 MPa, a protrusion of the electrically conductive paste on the front surface of the insulating substrate was subjected to pressure treatment using heated rolls. Next, the insulating substrate was heated at a temperature of about 200° C. for 15 minutes to obtain the circuit substrate.

Note that in plan view at a portion formed with the through-hole, a diameter of a center in a thickness direction was larger than diameters of portions formed on the front surface and the rear surface of the insulating substrate by about 2%.

The sample thus obtained was observed with a SEM manufactured by Hitachi High-Technologies Corporation, and was subjected to composition analysis with the EDX.

FIG. 6B-A shows images in a state where the electrically conductive paste was filled in the through-hole, FIG. 6B-B shows images after the protrusion was subjected to the pressure treatment and before the insulating substrate was heated, and FIG. 6B-C shows images after the protrusion was subjected to the pressure treatment and the insulating substrate was heated.

As illustrated in FIGS. 6B-A and 6B-B, before the protrusion was subjected to the pressure treatment, and before the insulating substrate was heated after the protrusion had been subjected to the pressure treatment, Cu included in the circuit pattern and Sn included in the electrically conductive paste caused unsatisfactory diffusional reaction. On the other hand, after the insulating substrate was heated, the diffusional reaction was satisfactory.

Second Working Example

Sample Nos. 2, 3
Circuit substrates were obtained in a manner similar to Sample No. 1 described above.
Sample Nos. 4, 5
Circuit substrates were obtained in a manner similar to Sample No. 1 described above, but the protrusion was not subjected to the pressure treatment.

As illustrated in FIG. 7A, any void was not produced in the circuit substrates of No. 2 and No. 3 that are working examples. In contrast, as illustrated in FIG. 7B, voids (portions indicated by arrows in FIG. 7B) were produced in the circuit substrates of No. 4 and No. 5 that are comparative examples.

Third Working Example

Sample No. 6
Circuit substrates were obtained in a manner similar to Sample No. 1 described above.
Sample Nos. 7, 8
Circuit substrates were obtained in a manner similar to Sample No. 1 described above, but the protrusion was not subjected to the pressure treatment. Note that a through-hole diameter φ of Sample No. 7 was set to 0.3 mm, and a through-hole diameter φ of Sample No. 8 was set to 0.25 mm.

A number of through-holes (a number of interlayer connection members) of each of Sample Nos. 6, 7, and 8 was 140.

An X-Y board hitester manufactured by HIOKI E.E. CORPORATION was used for those samples, and a sectional resistance-value histogram of a test element group (TEG) of 5600 points was made.

Further, a ratio of a resistance value of a circuit pattern to a resistance vale of an interlayer connection member ((the resistance value of the circuit pattern)/(the resistance vale of the interlayer connection member)) was calculated. Note that the resistance value of the circuit pattern was set to 1.0.

As illustrated in FIGS. 8A to 8C, the histogram of the circuit substrate of No. 6 (FIG. 8A) that is the working example was smaller in variation than those of the circuit substrate of No. 7 (FIG. 8B) and the circuit substrate of No. 8 (FIG. 8C) that are the comparative examples.

Further, the ratio of the resistance value of the circuit substrate of No. 6 that is the working example was 0.75, and the ratios of the resistance values of the circuit substrates of No. 7 and No. 8 that are the comparative examples were 1.3 and 1.8, respectively. In this manner, in the circuit substrate of No. 6 that is the working example, the resistance value of the interlayer connection member was lower than the resistance value of the circuit pattern.

Further, an average value of the resistance values in the interlayer connection members was calculated. As a result, Sample No. 6 was 1.256Ω, Sample No. 7 was 1.430Ω, and Sample No. 8 was 3.077Ω. In this manner, the resistance value of the interlayer connection member in the circuit substrate of No. 6 that is the working example was lower than those in the circuit substrates of No. 7 and No. 8 that are the comparative examples.

As described above, although the circuit substrate, the component-mounted substrate, and the methods of manufacturing the circuit substrate and the component mounting substrate according to the present embodiment have been specifically described in DETAILED DESCRIPTION, a gist of the present invention is not limited to the description, and should widely be construed according to the claims of the present invention. Further, for example, various modifications and alterations made based on the description are also involved in the gist of the present invention.

For example, in the method of manufacturing the circuit substrate, in the forming of the protrusion, the electrically conductive paste is filled in the through-hole from the front surface of the insulating substrate through the coating member with the screen printing. However, after the electrically conductive paste is filled from the front surface, the electrically conductive paste is filled in the through-hole from the rear surface of the insulating substrate through the coating member with the screen printing, whereby the protrusion can be formed on the rear surface of the insulating substrate.

Alternatively, in the forming of the protrusion, the electrically conductive paste is filled in the through-hole only from the rear surface of the insulating substrate, whereby the protrusion can be formed on the rear surface of the insulating substrate.

Furthermore, the method of manufacturing the circuit substrate and the method of manufacturing the component-mounted substrate can include another step between the respective steps described above, alternatively before or after the respective steps, within a range in which an adverse effect is not given to the respective steps described above. For example, a foreign-substance removing step for removing foreign substances mixed during manufacturing can be included.

The circuit substrate and the component-mounted substrate according to the embodiment of the present disclosure can be used for an electronic device and a display, for example.

What is claimed is:

1. A circuit substrate comprising:
a circuit pattern-provided insulating substrate including an insulating substrate and circuit patterns provided on a first surface and a second surface of the insulating substrate, the circuit pattern-provided insulating substrate having a through-hole penetrating the insulating substrate and the circuit patterns such that the through-hole extends from a first hole opening to a second hole opening; and
an electrically conductive paste filled in the through-hole and electrically connected to the circuit patterns, wherein
the circuit patterns contain Cu as a main component,
the electrically conductive paste is a melting-point shift electrically conductive paste including Sn—Bi solder powder, Cu powder, and resin, and
a diffusional reaction layer is provided where Cu included in the circuit patterns and Sn included in the electrically conductive paste cause a diffusional reaction in a portion where the electrically conductive paste and the circuit patterns are in contact with each other,
wherein a diameter of the through-hole at a center in a thickness direction of the circuit pattern-provided insulating substrate is larger than diameters of the first hole opening and the second hole opening,
wherein the diffusional reaction layer is made of two ring shaped portions, each of the two ring shaped portions has a diameter of a first end adjacent to the insulating substrate that is greater than a diameter of a second end opposing to the first end, and
wherein each of the ring shaped portions is disposed only between an inner periphery of one of the circuit patterns and an outer periphery of the electrically conductive paste.

2. The circuit substrate according to claim 1, wherein the diameter of the through-hole at the center in the thickness direction is larger than the diameters of the first hole opening and the second hole opening of the through-hole by 3% or more.

3. The circuit substrate according to claim 1, wherein a value calculated by dividing a thickness of each of the circuit patterns on the first surface and the second surface by a diameter of the through-hole at a portion formed on the first surface of the insulating substrate falls within a range of 0.075 or more to 0.25 or less.

4. The circuit substrate according to claim 1, wherein, the electrically conductive paste contains 40 parts by mass or more and 60 parts by mass or less of the Sn—Bi solder powder, and 20 parts by mass or more and 35 parts by mass or less of the Cu powder, with respect to 100 parts by mass of the electrically conductive paste.

5. The circuit substrate according to claim 1, wherein a thickness of the insulating substrate is 50 μm or more and 1000 μm or less.

6. The circuit substrate according to claim 1, wherein a linear expansion coefficient of the insulating substrate in a thickness direction is 50 ppm or less.

7. A component-mounted substrate comprising a component mounted on the circuit substrate according to claim 1.

8. The component-mounted substrate according to claim 7, wherein
the circuit substrate and the component are bonded with an adhesion layer, and
the adhesion layer is disposed over the electrically conductive paste, the circuit patterns on the first surface and the diffusional reaction layer.

9. The circuit substrate according to claim 1, wherein the electrically conductive paste filled in the through-hole is formed in a barrel shape in a cross-sectional view.

10. The circuit substrate according to claim 1, wherein a lateral surface of the through-hole of the circuit pattern-provided insulating substrate is formed in a curved shape.

11. The circuit substrate according to claim 1, wherein the diffusional reaction layer is disposed at a portion where the electrically conductive paste and the circuit patterns are horizontally adjacent to each other.

12. The circuit substrate according to claim 1, wherein the electrically conductive paste is free of a void.

* * * * *